（12) United States Patent
Bayerer

(10) Patent No.: US 9,041,196 B2
(45) Date of Patent: May 26, 2015

(54) SEMICONDUCTOR MODULE ARRANGEMENT AND METHOD FOR PRODUCING AND OPERATING A SEMICONDUCTOR MODULE ARRANGEMENT

(71) Applicant: Infineon Technologies AG, Neubiberg (DE)

(72) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/957,001

(22) Filed: Aug. 1, 2013

(65) Prior Publication Data

US 2014/0035118 A1 Feb. 6, 2014

(30) Foreign Application Priority Data

Aug. 1, 2012 (DE) .......................... 10 2012 213 573

(51) Int. Cl.
*H01L 23/34* (2006.01)
*H01L 23/367* (2006.01)
*H01L 23/049* (2006.01)
(Continued)

(52) U.S. Cl.
CPC ............ *H01L 23/367* (2013.01); *H01L 23/049* (2013.01); *H01L 23/36* (2013.01); *H01L 23/3735* (2013.01); *H01L 23/4006* (2013.01); *H01L 23/4093* (2013.01); *H01L 23/49811* (2013.01); *H01L 21/50* (2013.01); *H05K 1/0209* (2013.01); *H05K 1/141* (2013.01); *H05K 3/0061* (2013.01); *H05K 2201/0373* (2013.01); *H05K 2201/042* (2013.01); *H05K 2201/09781* (2013.01); *H05K 2201/10166* (2013.01); *H05K 2201/10303* (2013.01); *H05K 2201/10371* (2013.01); *H05K 2201/10409* (2013.01); *H01L 2224/48227* (2013.01); *H01L 25/072* (2013.01); *H01L 2924/13091* (2013.01)

(58) Field of Classification Search
USPC ................. 257/678, 706, 707, 711, 718, 722; 438/122, FOR. 413
See application file for complete search history.

(56) References Cited

U.S. PATENT DOCUMENTS 6,750,551 B1* 6/2004 Frutschy et al. .............. 257/785
7,564,129 B2* 7/2009 Nakanishi et al. ............ 257/722
(Continued)

FOREIGN PATENT DOCUMENTS

DE 102008056846 A1 6/2009
JP 2012064864 A 3/2012

*Primary Examiner* — Jasmine Clark
(74) *Attorney, Agent, or Firm* — Murphy, Bilak & Homiller, PLLC

(57) ABSTRACT

A semiconductor module arrangement includes a semiconductor module having a top side, an underside opposite the top side, and a plurality of electrical connection contacts formed at the top side. The semiconductor module arrangement additionally includes a printed circuit board, a heat sink having a mounting side, and one or a plurality of fixing elements for fixing the printed circuit board to the heat sink. Either a multiplicity of projections are formed at the underside of the semiconductor module and a multiplicity of receiving regions for receiving the projections are formed at the mounting side of the heat sink, or a multiplicity of projections are formed at the mounting side of the heat sink and a multiplicity of receiving regions for receiving the projections are formed at the underside of the semiconductor module. In any case, each of the projections extends into one of the receiving regions.

17 Claims, 13 Drawing Sheets

(51) Int. Cl.
*H01L 23/36* (2006.01)
*H01L 23/373* (2006.01)
*H01L 23/40* (2006.01)
*H01L 23/498* (2006.01)
*H01L 21/50* (2006.01)
*H05K 1/02* (2006.01)
*H05K 1/14* (2006.01)
*H01L 25/07* (2006.01)
*H05K 3/00* (2006.01)

(56) References Cited

U.S. PATENT DOCUMENTS

| | | | |
|---|---|---|---|
| 7,843,058 B2 * | 11/2010 | Tsao et al. | 257/718 |
| 7,898,076 B2 * | 3/2011 | Furman et al. | 257/706 |
| 8,159,822 B2 | 4/2012 | Kanschat et al. | |
| 2009/0200065 A1 | 8/2009 | Otoshi et al. | |
| 2011/0299253 A1 | 12/2011 | Nabilek | |

* cited by examiner

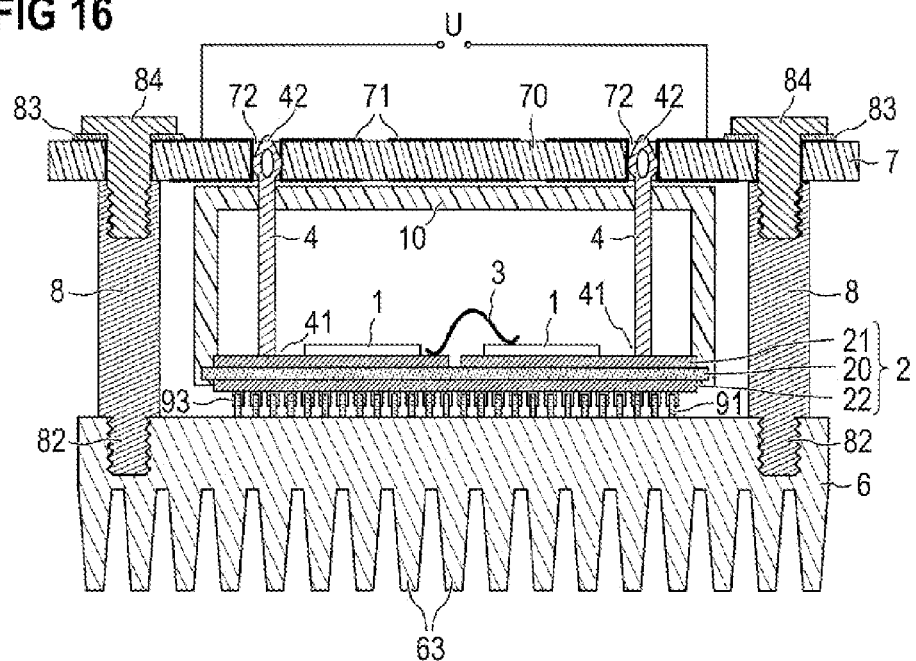
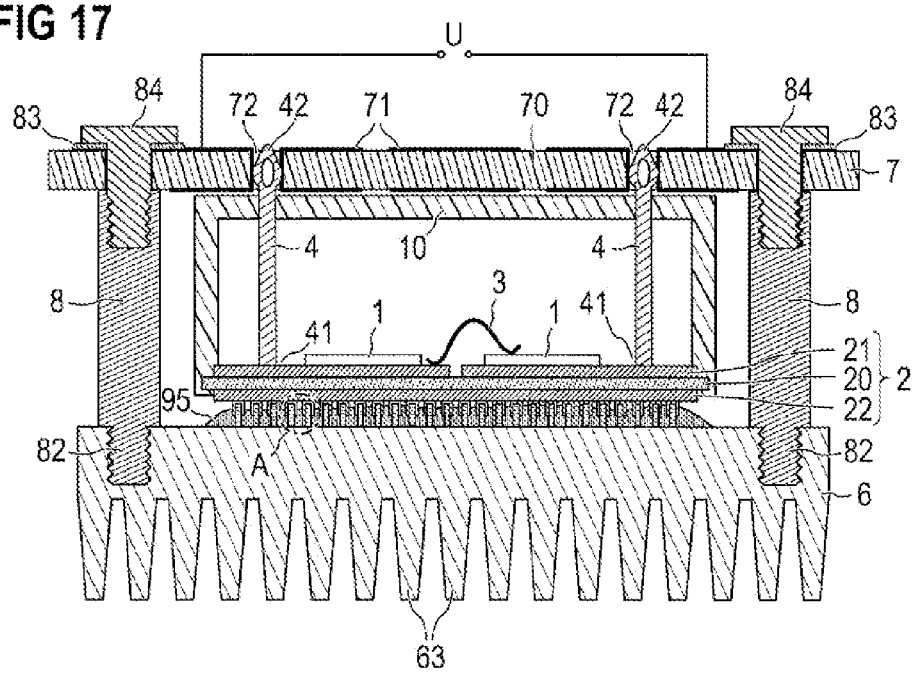

SEMICONDUCTOR MODULE ARRANGEMENT AND METHOD FOR PRODUCING AND OPERATING A SEMICONDUCTOR MODULE ARRANGEMENT

PRIORITY CLAIM

This application claims priority to German Patent Application No. 102012213573.1, filed on 1 Aug. 2012, the content of said German application incorporated herein by reference in its entirety.

BACKGROUND

Semiconductor modules, particularly when operated at high power levels, develop a very large amount of waste heat that has to be dissipated by suitable measures. There are many concepts for this purpose, but these concepts may be very complex and/or a hindrance during the operation of the semiconductor module arrangement. One practicable solution for cooling is liquid cooling, for example. However, this generally requires a closed liquid circuit during the operation of the semiconductor module. In some instances, pumps are also used to convey the liquid through a heat sink. Liquid-cooled heat sinks can have a compact and lightweight design, with the result that such heat sinks can also be integrated into a module (e.g., by direct soldering of substrates onto heat sinks), without giving rise to an excessive module size and weight. Such designs can still be dispatched all over the world at low cost.

Particularly in arrangements where liquid cooling is not available, air cooling may be used, which requires large heat sinks. In these arrangements as well as liquid heat sink arrangements that are large and heavy in comparison to standard modules, modules having planar base surfaces are used. In order to fill small uneven surfaces between the module and heat sink in a thermally conductive manner, a thermally conductive paste is introduced between the module and heat sink. The thermal conduction of such materials is defined by 1 W/(m*K) (where W=watts and m*K=kelvin-meters) and is better than air, but constitutes a certain heat barrier in comparison with the metallic contact partners.

SUMMARY

Embodiments disclosed herein provide a semiconductor module that can be mounted on a heat sink in a simple manner and enables the waste heat arising from the module to be dissipated efficiently. Methods for producing and operating such a semiconductor module arrangement are disclosed as well.

According to an embodiment, a semiconductor module arrangement is provided. The semiconductor module has a top side, an underside opposite the top side, and a plurality of electrical connection contacts formed at the top side. The module arrangement additionally includes a printed circuit board, a heat sink having a mounting side, and one or a plurality of fixing elements for fixing the printed circuit board to the heat sink. The printed circuit board is understood to mean any conventional printed circuit board (PCB), and additionally may be so-called laminated bus bars in which two or more conductor layers, which can be structured in each case, are aerially adhesively bonded (i.e. laminated) to one another by means of a dielectric respectively situated between two adjacent conductor layers. Likewise, so-called striplines may be regarded as a printed circuit board.

Either a multiplicity of projections are formed at the underside of the semiconductor module and a multiplicity of receiving regions for receiving the projections are formed at the mounting side of the heat sink, or a multiplicity of projections are formed at the mounting side of the heat sink and a multiplicity of receiving regions for receiving the projections are formed at the underside of the semiconductor module. In any case, each of the projections extends into one of the receiving regions. The projections and the receiving regions bring about an enlargement of the contact area between semiconductor module and heat sink in comparison with conventional arrangements, thus resulting in an improved dissipation of the waste heat from the semiconductor module toward the heat sink. The number of projections may vary, but as the number of projections increases, so does the size of the contact area between the semiconductor module and the heat sink. In this regard, the number of projections may be, for example, greater than or equal to 1 per $cm^2$ of the basic area of the module.

To enable the semiconductor module to be fixed to the heat sink in a simple manner, the semiconductor module has no direct positively locking connection to the heat sink. In other words, either no positively locking connection at all is effected between the semiconductor module and the heat sink, or else each positively locking connection between the semiconductor module and the heat sink is effected only indirectly via the printed circuit board, to which the semiconductor module is electrically conductive and connected in a sufficiently mechanically stable manner via its connection contacts.

According to a further embodiment, a method for producing a semiconductor module arrangement is provided. The method includes providing a semiconductor module, having a top side, and an underside opposite the top side, and a plurality of electrical connection contacts formed at the top side, providing a printed circuit board, and providing a heat sink having a mounting side. Either a multiplicity of projections are formed at the underside of the semiconductor module and a multiplicity of receiving regions for receiving the projections are formed at the mounting side of the heat sink, or a multiplicity of projections are formed at the mounting side of the heat sink and a multiplicity of receiving regions for receiving the projections are formed at the underside. The method further includes providing one or more fixing elements, producing electrically conductive connections between the connection contacts and the printed circuit board, and introducing each of the projections into one of the receiving regions, such that each of the projections is at least partly situated in depressions of the receiving regions. The method further includes connecting the printed circuit board to the heat sink by means of the fixing elements such that either there is no positively locking connection between the semiconductor module and the heat sink, or that each positively locking connection between the semiconductor module and the heat sink is effected only indirectly via the printed circuit board.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 16 shows the finished mounted semiconductor module arrangement in accordance with FIGS. 14 and 15.

FIG. 17 shows the finished mounted semiconductor module arrangement in accordance with FIGS. 14 to 16, wherein an optional adhesive layer is introduced between the semiconductor module and the heat sink.

DETAILED DESCRIPTION

Figure 1:
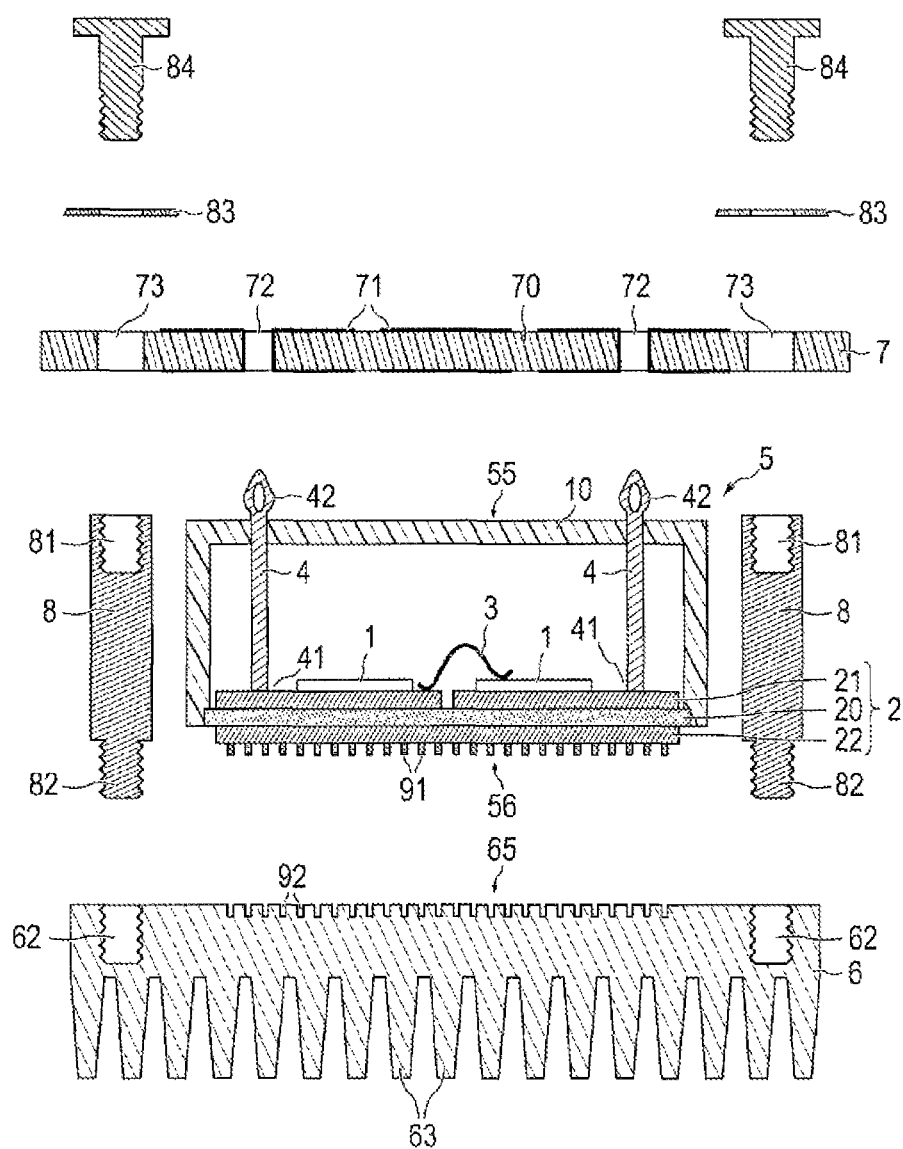
FIG. 1 shows a sectional view of the components of an exemplary semiconductor module arrangement before the mounting thereof, wherein the projections are fitted on the semiconductor module and the receiving regions are fitted on the heat sink.

FIG. 1 shows a sectional view through a semiconductor module arrangement before the mounting thereof. The semiconductor module arrangement comprises a semiconductor module 5, a heat sink 6, a printed circuit board 7 and optional fixing elements 8. The semiconductor module 5 has one or a plurality of semiconductor chips (also referred to herein as components) 1, for example MOSFETs, IGBTs, junction field-effect transistors, thyristors, diodes or any other semiconductor components. The semiconductor components 1 are mounted on a circuit carrier 2, from which, during the operation of the semiconductor module, a significant proportion of the waste heat arising from the semiconductor components 1 is dissipated toward the heat sink 6. The circuit carrier 2 has an insulation carrier 20, to which an upper metallization layer 21 and a lower metallization layer 22 are applied. The insulation carrier 2, which may be a thin ceramic lamina, for example, insulates the upper metallization layer 21 from the lower metallization layer 22. The upper metallization layer 21 can optionally be structured to form conductor tracks which can be used for the interconnection of the semiconductor component or components 1 and/or, if appropriate, further optional electrical components. Moreover, further interconnection elements such as the bonding wire 3 shown by way of example in FIG. 1 can optionally be present. Instead of or in addition to the bonding wires 3, any other electrical connecting elements can also be used. By way of example, stamped and bent parts composed of sheet metal that is electrically connected to the upper metallization layer 21 and/or the semiconductor components 1 may be used. In principle, the type and construction of the circuit realized on the circuit carrier 2 may vary.

For the electrical operation of the semiconductor module 5, electrical connection contacts 42 are additionally present, from which an electrical supply voltage and/or an electrical load may be connected to the semiconductor module 5. As shown in FIG. 1, the connection contacts 42 are embodied as press-fit contacts that can be press-fitted into corresponding electrical contact openings 72 in the printed circuit board 7. Prior to press-fitting, such press-fit contacts 42 have an excess size relative to the associated electrical contact openings 72, with the result that the connection contacts 42 are slightly deformed during the press-fitting process. The press-fitting of such press-fit contacts 42 into associated electrical contact openings 72 in the printed circuit board can be effected in accordance with DIN 41611-9:1987-12: "Lötfreie elektrische Verbindungen; Abisolierfreie Wickelverbindungen; Begriffe, Kennwerte, Anforderungen, Prüfungen" ["Solderless electrical connections; wrapped connections, without wire stripping; terms and definitions, ratings, requirements, tests"] or in accordance with DIN EN (IEC) 60352-5, 2008-11: "Lötfreie Verbindungen—Teil 5: Einpressverbindungen—Allgemeine Anforderungen, Prüfverfahren and Anwendungshinweise (IEC 60352-5:2008)", ["Solderless connections—part 5: Press-fit connections—general requirements, test methods and practical guidance (IEC 60352-5:2008)"], both obtainable from Beuth Verlag GmbH, Berlin.

As an alternative to press-fit contacts, however, the connection contacts 42 could, for example, also be configured as soldering pins that are inserted into the electrical contact openings 72 in the printed circuit board 7 and then soldered therein. However, the electrical connections between the semiconductor module 5 and the printed circuit board 7 may also be electrically conductively connected to the printed circuit board 7 with the aid of screw or clamping connections. The electrical contacts thus also serve for mechanically fixing and retaining the semiconductor module 5 on the printed circuit board.

As shown in FIG. 1, the contact holes 72 in the printed circuit board 7 can be embodied as metalized through-openings that are connected to conductor tracks 71 applied to a dielectric carrier 70.

As is additionally shown in FIG. 1, the connection contacts 42 may be parts of an electrical connection element 4 that is electrically conductively connected to the upper metallization layer 21 at a contact location 41.

Optionally, the semiconductor module 5 may have a housing 10, wherein the semiconductor chip or chips 1 is/are arranged. If a housing 10 is present, the connection contacts 42 are accessible from the outer side of the housing 10. Thus, the connection contacts 42 can be arranged on the outer side of the housing 10 at the top side 55 of the semiconductor module 5.

The heat sink 6 consists of a material having a high heat capacity, for example a metal (e.g. copper, aluminum, a copper alloy or an aluminum alloy). Furthermore, the heat sink 6 has a mounting side 65, from which the semiconductor module 5 can be mounted. Optionally, the heat sink 6 may additionally be equipped with a plurality of cooling ribs 63.

The semiconductor module 5 has a number of projections 91, at underside 56 of semiconductor module 5, opposite the top side 55, which can be introduced into corresponding receiving regions 92 on the heat sink 6 during the mounting of the semiconductor module 5 on the mounting surface 65 of the heat sink 6, such that each of the projections 91 is at least partly arranged in one of the receiving regions 92. Because the projections 91 consist of a material having good thermal conductivity, the structure provided significantly enlarges the contact area crucial for heat exchange with the heat sink and thus significantly improves the heat dissipation from the semiconductor chips 1 toward the heat sink 6 in comparison with conventional arrangements.

The projections 91 may be pins or as ribs, for example, and the receiving regions 92 may be embodied as drilled holes or as elongate, for example, milled trenches that extend into the heat sink 6 at the mounting surface 65.

To produce a semiconductor module arrangement, a composite assembly comprising the semiconductor module 5, the heat sink 6 and the printed circuit board 7 is produced in such a way that the connection contacts 42 are electrically conductively connected to the printed circuit board 7, and that each of the projections 91 is at least partly arranged in one of the receiving regions 92.

This configuration allows for, either no positively locking connection at all effected between the semiconductor module 5 and the heat sink 6, or —if one or a plurality of positively locking connections are present—the latter are effected without exception only indirectly via the printed circuit board 7. That means that the printed circuit board 7 in these cases is connected to the heat sink 6 by means of one or a plurality of positively locking connections and the respective positively locking connections act on the semiconductor module 5 only indirectly via the printed circuit board 7.

Figure 2:
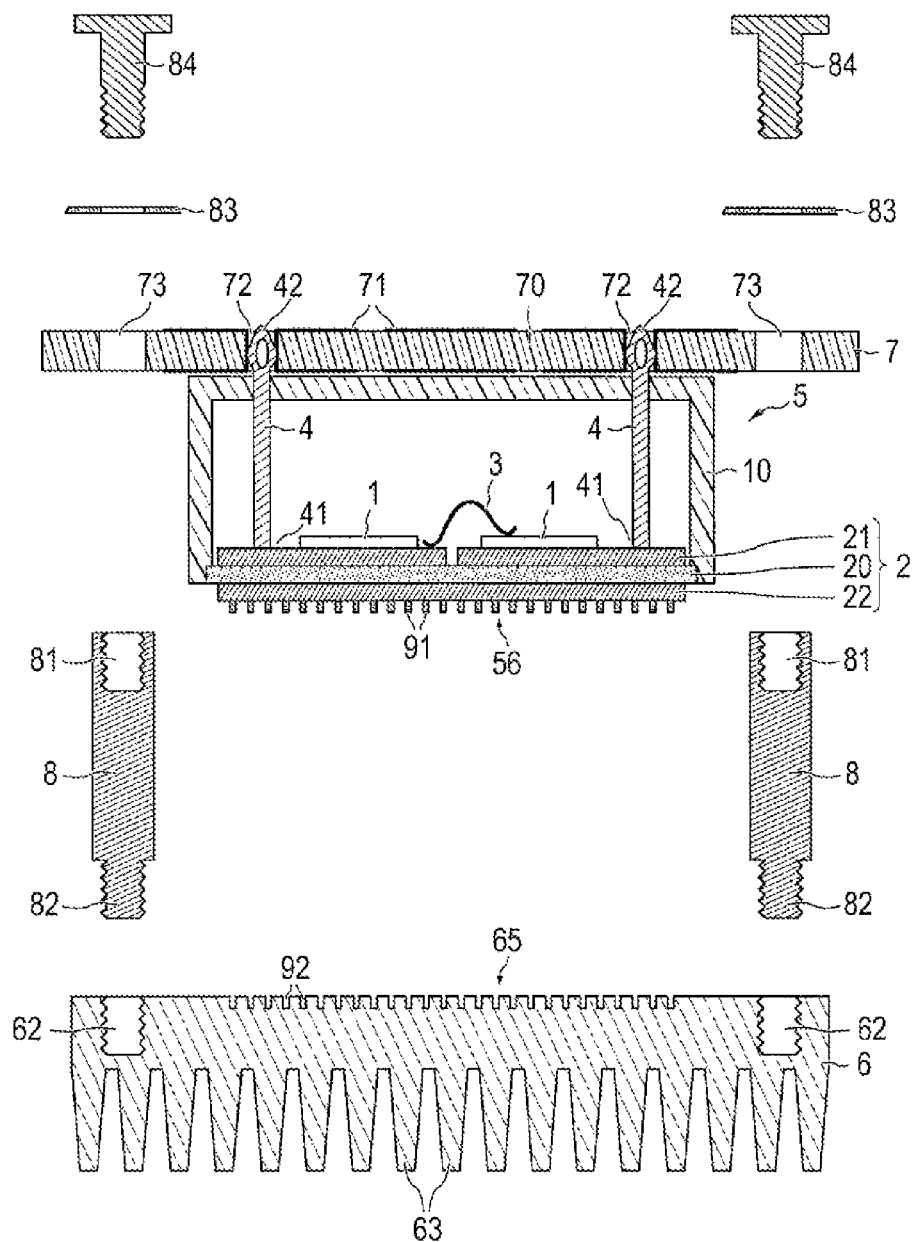
FIG. 2 shows the components of FIG. 1 after the semiconductor module has been mounted on the printed circuit board.

As illustrated in FIG. 2, the mounting of the semiconductor module arrangement can be effected such that before the semiconductor module 5 is mounted on the heat sink 6, the electrically conductive connections between the connection contacts 42 and the printed circuit board 7 are produced, and only afterward is the composite assembly comprising the semiconductor module 5 and the printed circuit board 7 mounted on the mounting surface 65 of the heat sink 6 in such a way that each of the projections 91 is at least partly arranged in one of the receiving regions 92.

In the example shown, a force-locking connection between the printed circuit board 7 and the heat sink 6 is effected with the aid of fixing elements 8, each having a spacer with an internal thread 81 and an external thread 82, and a fixing screw 84. The printed circuit board 7 has a mounting opening 73 for each of the screws 84, through which mounting opening the respective screw 84 can be led and screwed to the internal thread 81. Correspondingly, the heat sink 6 has an internal thread 62 matching each of the external threads 82, such that the spacer with the external thread 82 can be screwed into the associated internal thread 62 and can thereby be fixedly connected to the heat sink 6. In this way, a positively locking connection between the printed circuit board 7 and the heat sink 6 is produced by each of the fixing elements 8.

Optionally, washers 83 can also be provided at various locations. Only washers 83 between the fixing screws 84 and the printed circuit board 7 are shown in the present example.

Figure 3:
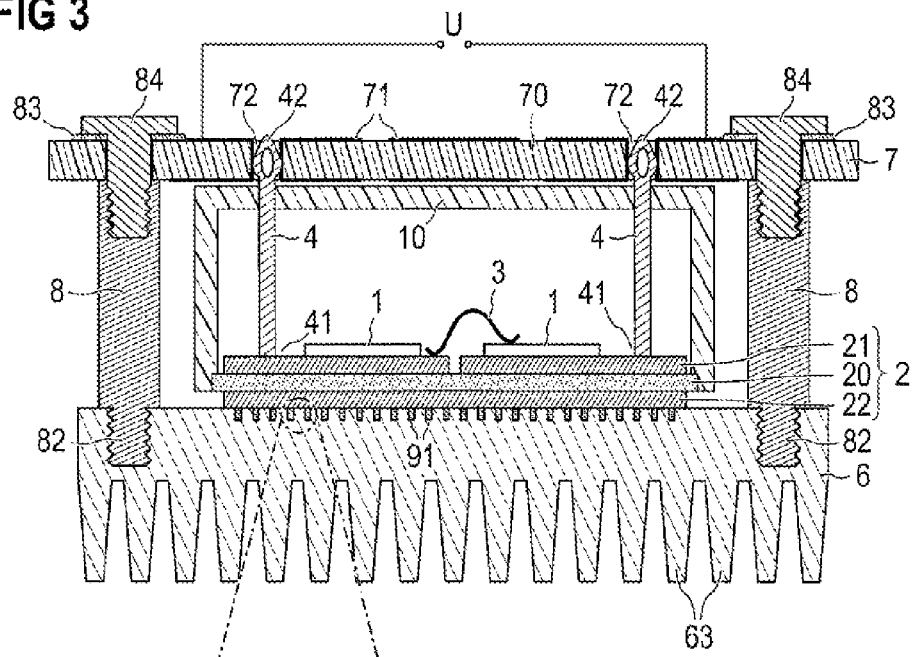
FIG. 3 shows the completed semiconductor module arrangement in accordance with FIGS. 1 and 2.

FIG. 3 shows the semiconductor module arrangement of FIGS. 1-2 in the finished mounted state. FIG. 3 likewise shows that an electrical voltage U can be connected to the finished mounted semiconductor module arrangement by said voltage being fed to two connection contacts 42 of the semiconductor module 5 via conductor tracks 71 of the printed circuit board 7.

All of the fixing elements 8 depicted in FIGS. 1-3, as well as in other embodiments, are elements of the semiconductor module arrangement that are independent of the semiconductor module 5. The fixing elements 8 for producing one or a plurality of positively locking connections between the printed circuit board 7 and the heat sink 6 may in this case, as well as other embodiments, be arranged outside a module housing 10 in which the semiconductor chip or chips is/are arranged. Thus, none of the fixing elements 8 are led through a mounting opening in the module housing 10. Therefore, all the fixing elements 8 may be arranged laterally alongside the module housing 10 for example as shown.

Correspondingly, the semiconductor module 5 overall has no fixing opening through which a fixing element 8 that produces a positively locking connection between the printed circuit board 7 and the heat sink 6 is led.

Figure 4A:
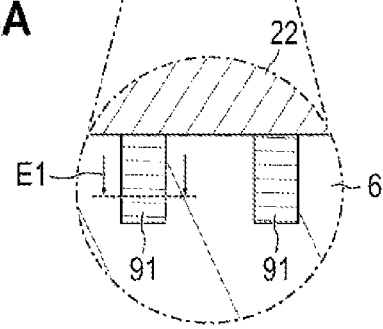
FIG. 4A shows an enlarged excerpt from the semiconductor module depicted in FIG. 3.
Figure 4B:
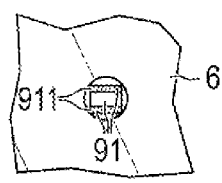
FIG. 4B shows a horizontal sectional view through a projection in a sectional plane E1 shown in FIG. 4A.

FIG. 4A shows an enlarged excerpt from the arrangement in accordance with FIG. 3 with two projections 91 that are fixedly connected to the lower metallization layer 22 of the circuit carrier 2. Examples of suitable connecting techniques include welding, e.g., arc welding, bonding or soldering or sintering. As is shown in the sectional view in accordance with FIG. 4B in the plane E1, the projection 91 may be embodied as a spring element. In the example shown, the projection 91 has a spring fork having two resilient portions 911. The resilient portions 911 are prestressed during the press-fitting of the relevant projection 91 into the associated receiving region 92, thus giving rise to force-locking connections.

Figure 5A:
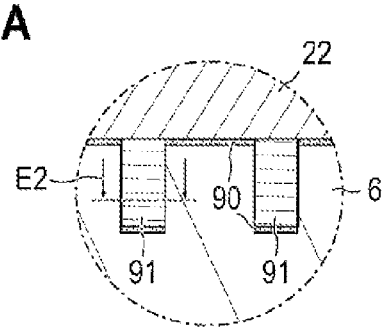
FIG. 5A shows the portion depicted in FIG. 4A in an alternative configuration of the semiconductor module arrangement, wherein a heat transfer medium is introduced between the projections and the respective receiving regions.
Figure 5B:
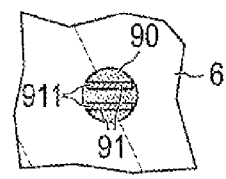
FIG. 5B shows a horizontal sectional view through a projection in a sectional plane E2 shown in FIG. 5A.

FIG. 5A shows the same excerpt as FIG. 4A with the difference that a heat transfer medium 90 is introduced between the semiconductor module 5 and the heat sink 6. The heat transfer medium 90 may be a thermally conductive paste, for example, or a phase change material. The thermal conductivity of the heat transfer medium 90 may be for example 0.4 W/(m·K) to 1 W/(m·K) (where W=watts and m·K=kelvinmeters), which corresponds to the thermal conductivities of commercially known raw materials. On account of the disclosed geometry, even more highly filled materials having a thermal conductivity of greater than 1 W/(m·K) may be used. The viscosity of a thermally conductive paste rises with the degree of filling. For this reason, thermally conductive pastes having a high degree of filling may not be pressed to form a thin layer as easily as in the case of planar contact areas between the semiconductor module and heat sink. By virtue of the presently disclosed structure having the projections 91 and the receiving regions 92, the pressure does not have to be applied vertically as surface pressure between semiconductor module 5 and heat sink 6. Rather, pressure generated by descent into the receiving regions 92 substantially in a lateral direction. FIG. 5B shows a sectional view in the region of one of the projections 91 in a sectional plane E2.

Figure 6A:
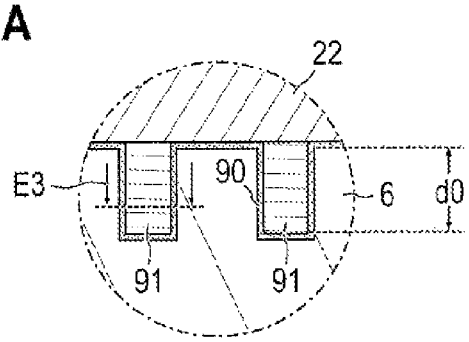
FIG. 6A shows the portion depicted in FIG. 4A in a further alternative configuration of the semiconductor module arrangement, wherein the projections descend into the respective receiving regions without a force-locking connection.
Figure 6B:
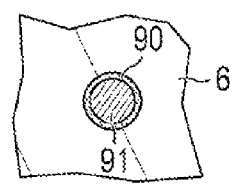
FIG. 6B shows a horizontal sectional view through a projection in a sectional plane E3 shown in FIG. 6A.

While a force-locking connection between the projections 91 and the respective receiving region is present in the examples in accordance with FIGS. 4A and 5A, in the further alternative embodiments shown in FIGS. 6A and 6B, the projections 91 descend into the respective receiving regions 92 without a force-locking connection. Here, too, a heat transfer medium 90, as described above, may optionally be present. FIG. 6B shows a sectional view through one of the projections 91 in a sectional plane E3.

FIG. 6A likewise illustrates the depth d0 of descent with which the projections 91 descend into the respectively corresponding receiving region 92. In this as in all other disclosed embodiments, depth d0 of descent can be chosen to be, for example greater than or equal to 3 mm, or greater than or equal to 5 mm.

Figure 7A:
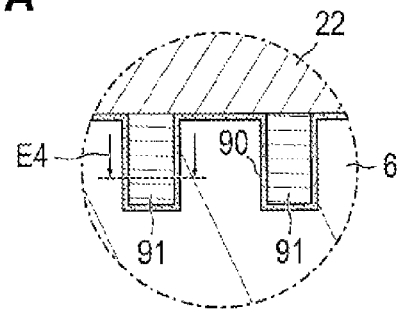
FIG. 7A shows the portion depicted in FIG. 4A in a further alternative configuration of the semiconductor module arrangement, wherein the projections are press-fitted into the respective receiving regions with plastic deformation of the projections and/or of the receiving regions.
Figure 7B:
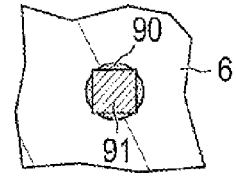
FIG. 7B shows a horizontal sectional view through a projection in a sectional plane E4 shown in FIG. 7A.

An alternative embodiment of the projections 91 is illustrated in FIGS. 7A and 7B. Here, the projections 91 have an excess size relative to the associated receiving regions 92 before the semiconductor module 5 is mounted on the heat sink 6, such that said projections 91 have to be press-fitted into the respective receiving region 92. Plastic deformations of the projection 91 and/or of the receiving region 92 occur in this case. Here, too, a heat conducting medium 90 can optionally be used, such as has been explained above. FIG. 7B shows a sectional view through one of the projections 91 in a sectional plane E4.

Figure 8:
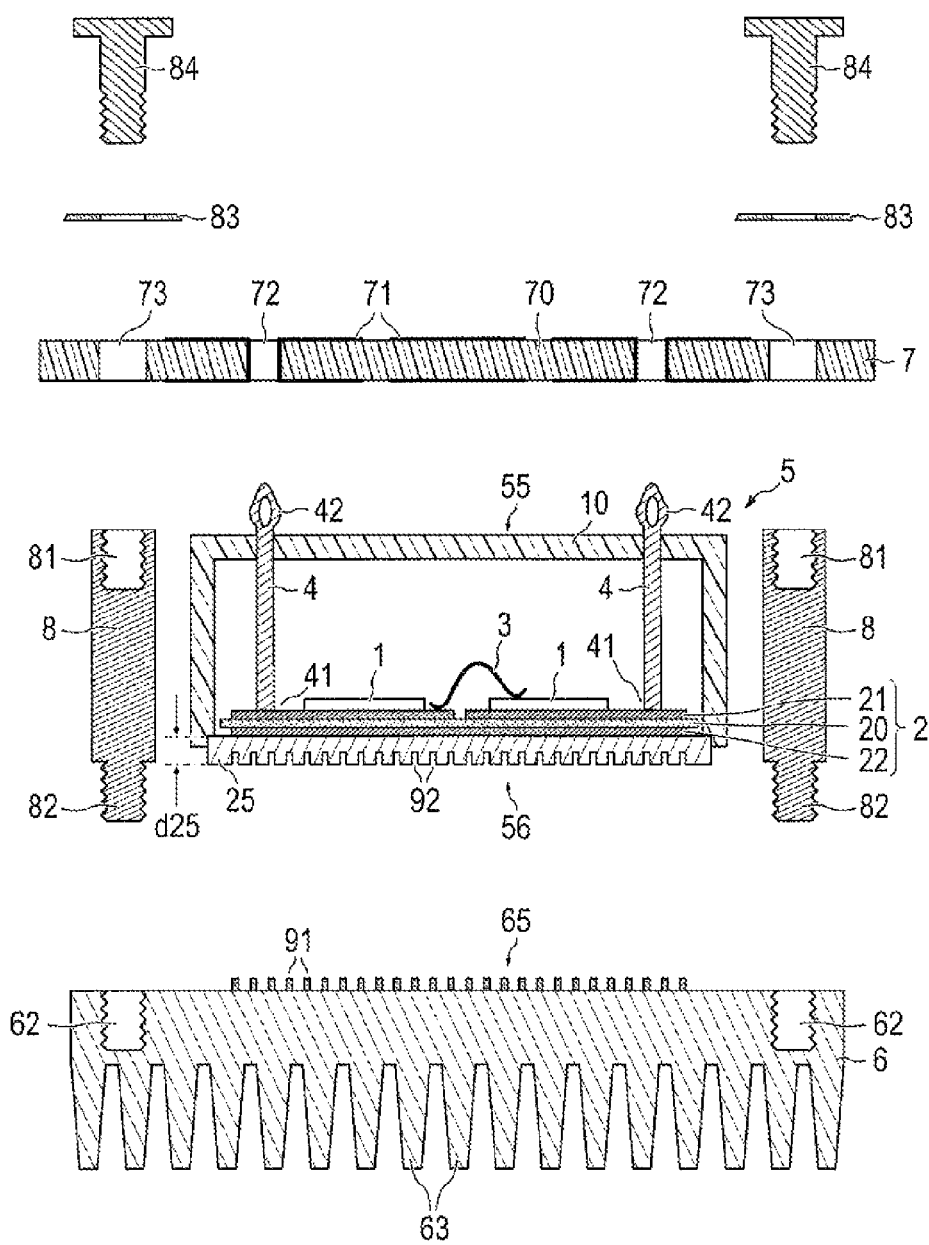
FIG. 8 shows a sectional view of the components of a further exemplary semiconductor module arrangement before the mounting thereof, wherein the projections are fitted on the heat sink and the receiving regions are fitted on the semiconductor module.
Figure 9:
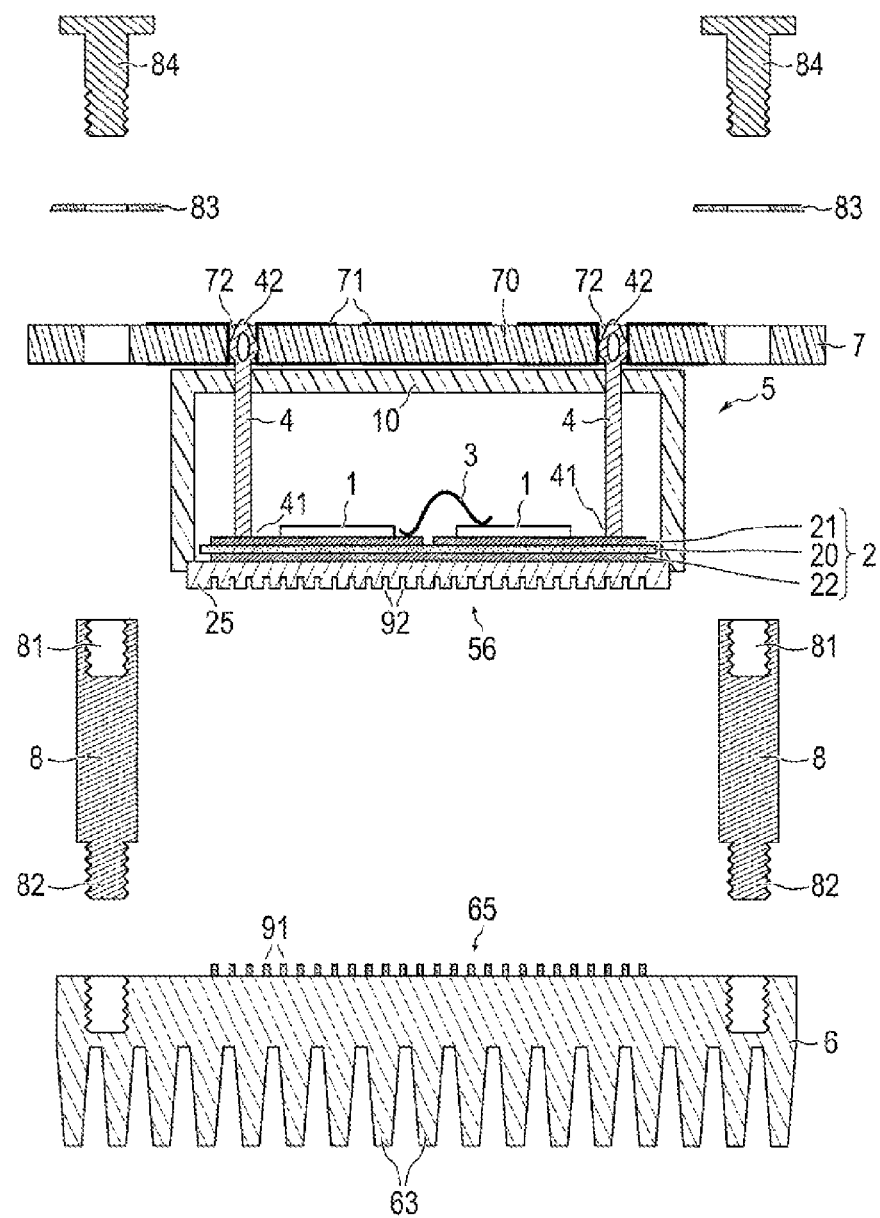
FIG. 9 shows the components depicted in FIG. 8 after the semiconductor module has been mounted on the printed circuit board.

Further embodiments will now be explained with reference to FIGS. 8 to 10. These example differ from the example explained with reference to FIGS. 1 to 3 in that the projections 91 are situated on the mounting surface 65 of the heat sink 6 and the receiving regions 92 are situated on the semiconductor module 5. For this purpose, the semiconductor module 5 additionally has, in comparison to the semiconductor module 5 shown in FIGS. 1 to 3, a solid baseplate 25, to which the circuit carrier 2 is connected, for example by soldering, sintering or adhesive bonding. The thickness d25 of the baseplate 25, if such a baseplate is provided, may be, for example, at least 2 mm or at least 3 mm. While FIG. 8 shows the individual constituent parts of the semiconductor module arrangement in the unmounted state, in FIG. 9 the electrical contacts 42 have already been electrically conductively connected to the printed circuit board 7. For this purpose, it is possible to use the techniques for connection between the electrical contacts 42 and the printed circuit board 7 as already explained with reference to FIGS. 1 to 3.

Figure 10:
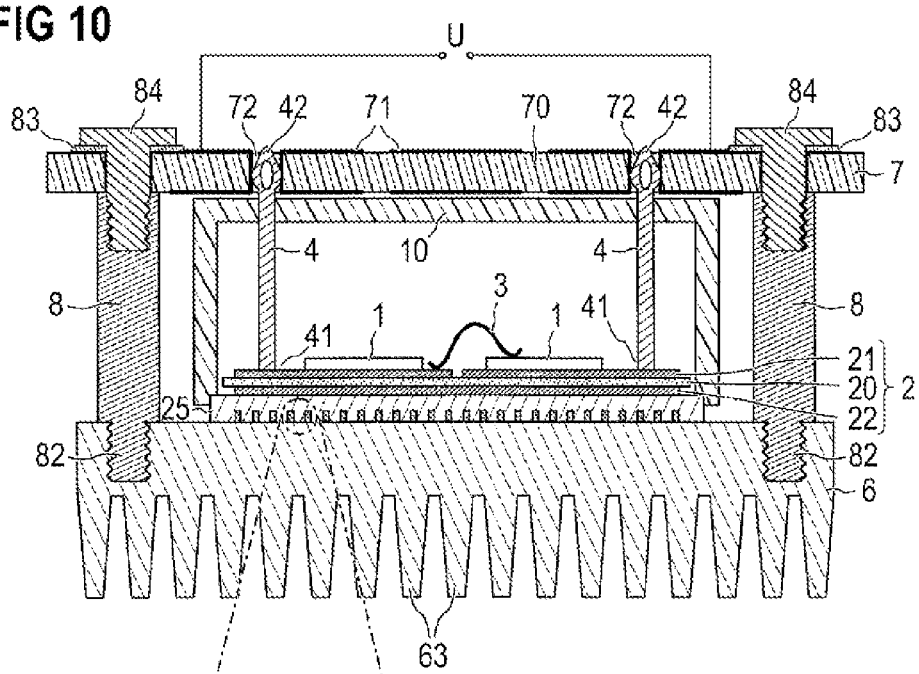
FIG. 10 shows the completed semiconductor module arrangement in accordance with FIGS. 8 and 9.

FIG. 10 shows the finished mounted semiconductor module arrangement, wherein each of the projections 91 situated on the heat sink 6 descends at least partly into a corresponding receiving region 92 of the semiconductor module 5.

Figure 11A:
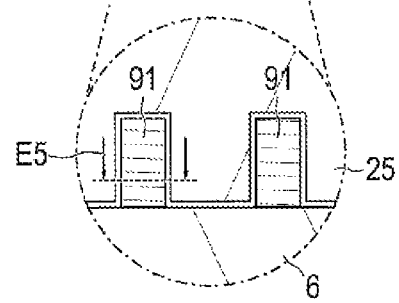
FIG. 11A shows an enlarged excerpt from the view depicted in FIG. 10, and illustrates projections that are press-fitted into the respective receiving regions with plastic deformation of the projections and/or of the receiving regions.
Figure 11B:
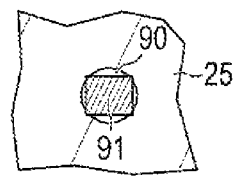
FIG. 11B shows a horizontal sectional view through a projection in a sectional plane E5 shown in FIG. 11A.
Figure 12A:
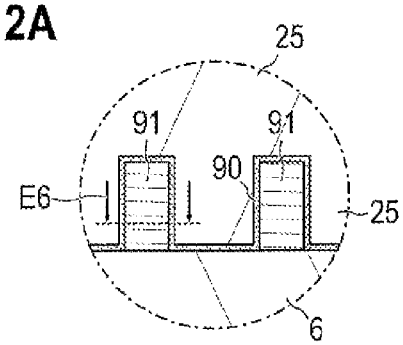
FIG. 12A shows the portion depicted in FIG. 11A in an alternative configuration of the semiconductor module arrangement, wherein a heat transfer medium is additionally introduced between the projections and the respective receiving regions.
Figure 12B:
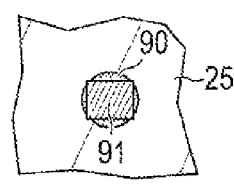
FIG. 12B shows a horizontal sectional view through a projection in a sectional plane E6 shown in FIG. 12A.

FIG. 11A shows an enlarged excerpt from the view in accordance with FIG. 10 with two projections 91 of the heat sink 6, and FIG. 11B shows a sectional view through one of said projections 91 in a sectional plane E5. As in the example in accordance with FIGS. 7A and 7B, the projections 91 have an excess size relative to the associated receiving regions 92 before the semiconductor module 5 is mounted on the heat sink 6, such that said projections have to be press-fitted into the receiving regions 92 with plastic deformation of the projections 91 and/or of the receiving regions 92 during the mounting of the semiconductor module 5 on the heat sink 6. As is shown in FIGS. 11A and 11B, it is possible to dispense with a heat conducting medium between the semiconductor module 5 and the heat sink 6, but it is also possible to provide a heat conducting medium 90, as is shown in FIGS. 12A and 12B, which otherwise correspond to the arrangement in accordance with FIGS. 11A and 11B respectively. FIG. 12B shows a sectional view through one of the projections 91 shown in FIG. 12A in a sectional plane E6.

Figure 13A:
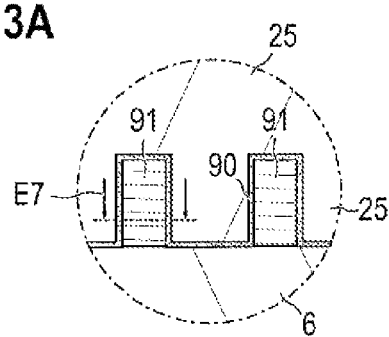
FIG. 13A shows the portion in accordance with FIG. 11A in a further alternative configuration of the semiconductor module arrangement, wherein the projections descend into the respective receiving regions without a force-locking connection.
Figure 13B:
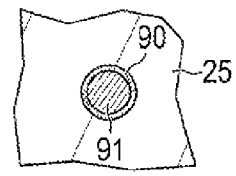
FIG. 13B shows a horizontal sectional view through a projection in a sectional plane E7 shown in FIG. 13A.

Yet another alternative configuration is shown in FIGS. 13A and 13B. This configuration is identical to the configuration of FIGS. 6A and 6B, except that the projections 91 are situated on the heat sink 6 and the associated receiving regions 92 are situated on the semiconductor module 5. FIG. 13B shows a sectional view through one of the projections 91 shown in FIG. 13A in a sectional plane E7.

Figure 14:
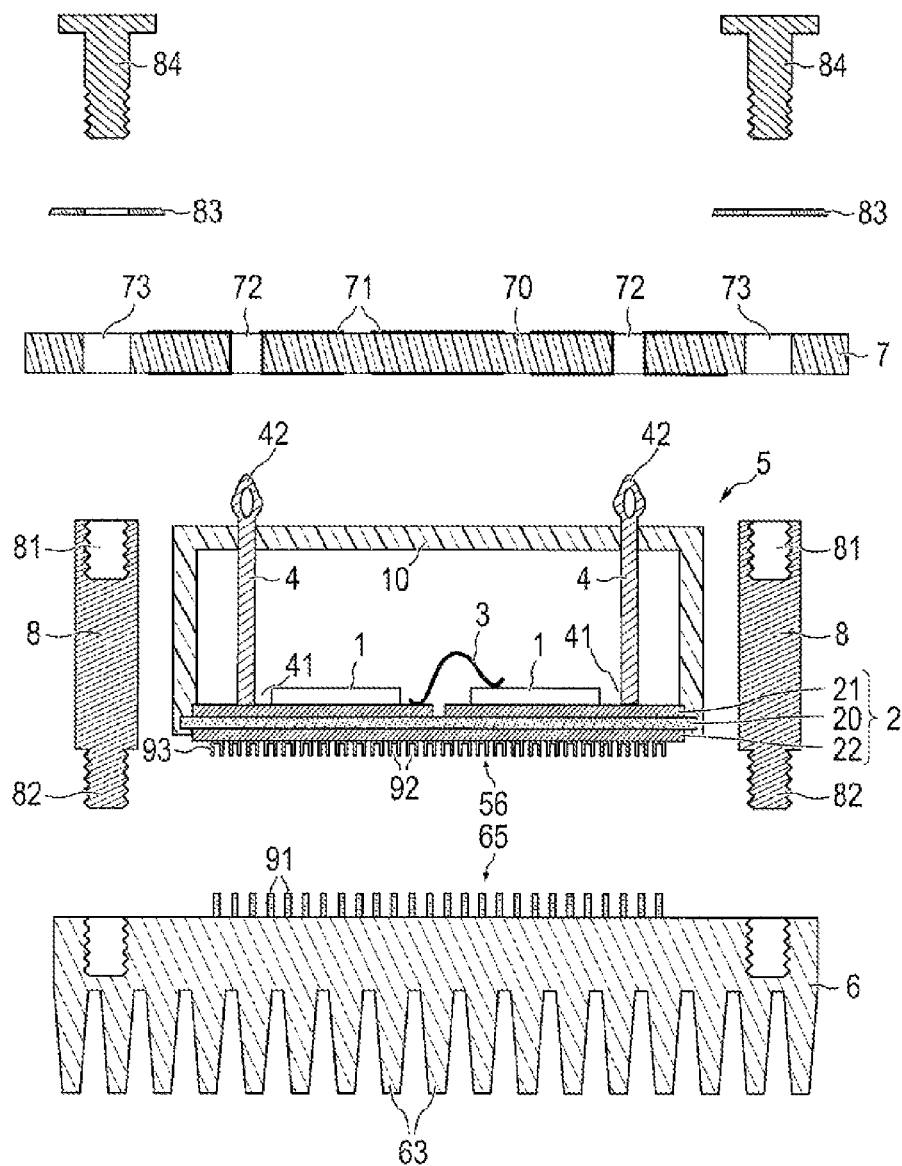
FIG. 14 shows a sectional view of the components of a further exemplary semiconductor module arrangement before the mounting thereof, which differs from the previously depicted semiconductor module arrangements in that receiving regions are embodied as soldered sleeves.
Figure 15:
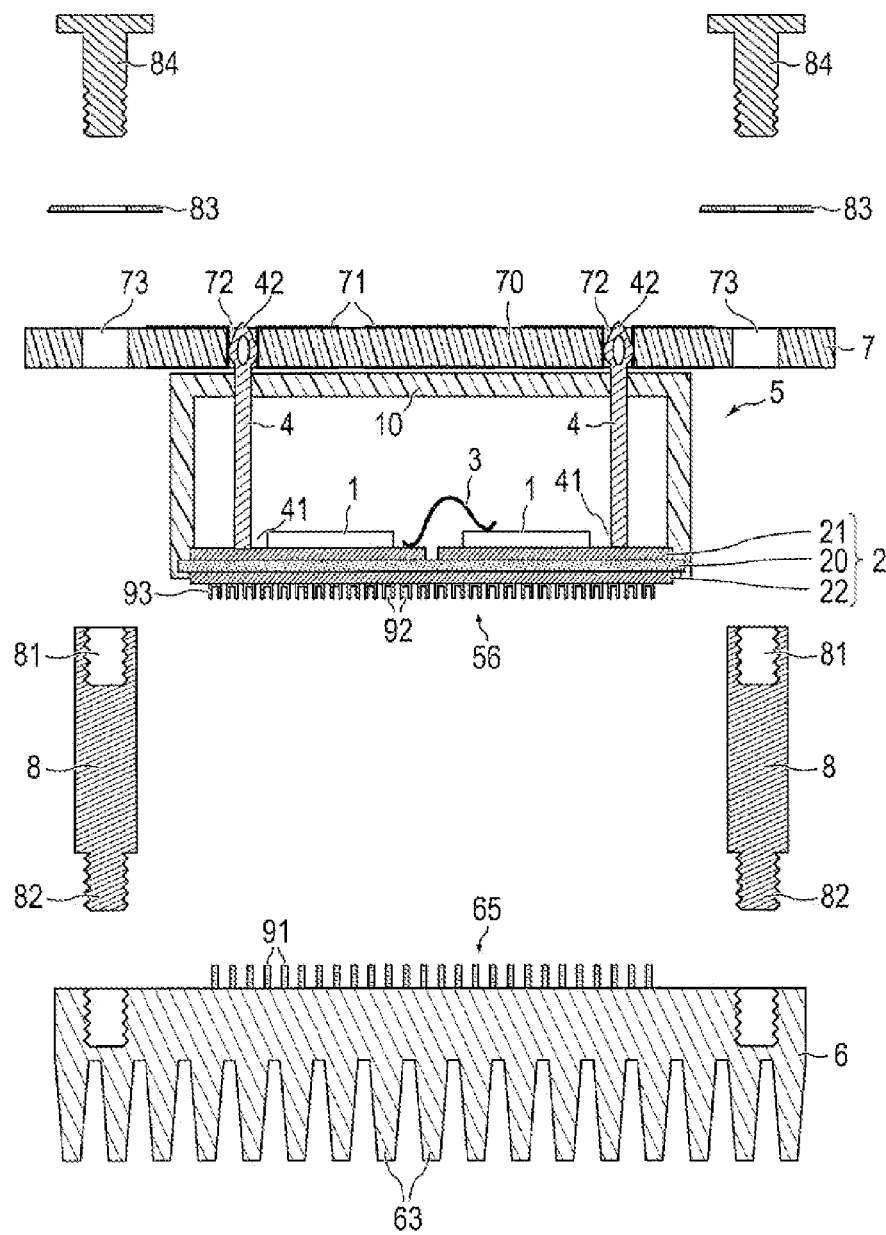
FIG. 15 shows the components of FIG. 14 after the semiconductor module has been mounted on the printed circuit board.

While the receiving regions 92 shown previously were depicted as drilled holes or slots either in a heat sink 6 or in a baseplate 25 of a semiconductor module 5, in a further example explained with reference to FIGS. 14 to 16, the receiving regions 92 are formed by sleeves 93 fixed to the lower metallization 22 of the circuit carrier 2, for example by soldering, sintering or adhesive bonding. The projections 91, by contrast, are parts of the heat sink 6 and can be fixed thereto as already explained with reference to FIGS. 8 to 11. FIG. 14 shows the individual elements of the semiconductor module arrangement, and FIG. 15 in turn shows the semiconductor module 5 connected to the printed circuit board 7 by the electrical contacts 42. The electrical connections between the electrical contacts 42 and the printed circuit board 7 can be produced as already explained above with reference to FIGS. 1 to 3. FIG. 16 shows the finished mounted semiconductor module arrangement.

Optionally, the semiconductor module 5, as is shown in FIG. 17, can also be fixed to the heat sink 6 by means of a thermally conductive adhesive 95. The adhesive 95 can be applied before or after the insertion of the projections 91 into the receiving regions 92. In this case, the adhesive 95 can also additionally perform the function of a heat transfer medium.

Figure 18A:
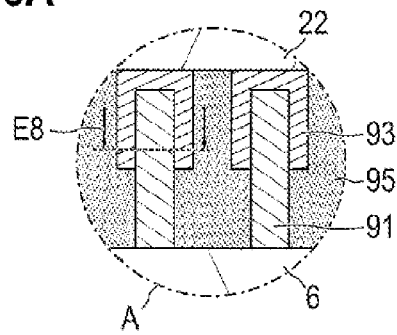
FIG. 18A shows an enlarged excerpt A from the view depicted in FIG. 17.
Figure 18B:
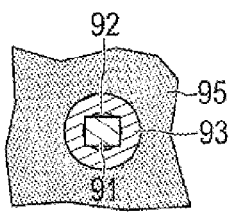
FIG. 18B shows a horizontal sectional view through a projection in a sectional plane E8 shown in FIG. 18A.

FIG. 18A shows an enlarged portion A of the view in accordance with FIG. 17 with two projections 91 of the heat sink 6, which are respectively press-fitted into a corresponding sleeve 93 on the semiconductor module 5. The sectional view in accordance with FIG. 18B in a sectional plane E8 illustrates that the press-fitting can be effected with plastic deformation of the projections 91 and/or of the receiving regions.

Although the same screw connection with the aid of the fixing elements 8 was explained in the previous methods for fixing the printed circuit board 7 to the heat sink 6, this is merely an example of a positively locking connection. The connection can also be realized, in principle, with any other positively locking connection techniques. For example, FIG. 20 shows a finished mounted semiconductor module arrangement in which the connecting elements 8 connect the printed circuit board 7 to the heat sink 6 by latching rather than by screwing. For this purpose, the mounting elements 8 have resilient latching lugs 87 and 88 respectively at opposite ends, the latching lugs 87 respectively being snapped into corresponding mounting openings 73 in the printed circuit board 7 and the latching lugs 88 being snapped into corresponding mounting openings 68 in the heat sink 6.

Figure 19:
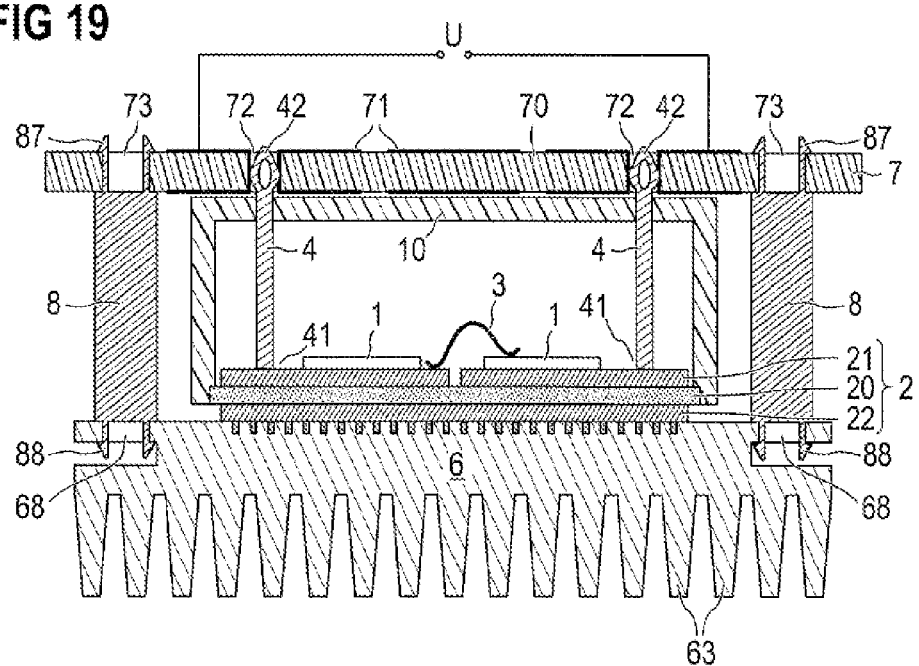
FIG. 19 shows a sectional view of a further exemplary finished mounted semiconductor module arrangement, which differs from the semiconductor module arrangements of previously depicted examples in that the fixing elements are fixed to the heat sink and to the printed circuit board by means of latching lugs.

Apart from the different configuration of the fixing elements 8 and the adaptation of the heat sink 6 to the latching lugs 88, the semiconductor module arrangement of FIG. 19 is identical to the semiconductor module arrangement in FIGS. 1 to 3. This applies in particular to the type and configuration of the projections 91 and of the receiving regions 92. The principle of the latching technique explained with reference to FIG. 20 for producing a positively locking connection between the printed circuit board 7 and the heat sink 6 can also be realized with all other configurations of the projections 91 and the receiving regions 92, to be precise in particular also with all configurations explained above.

It is also possible to realize different positively locking connection techniques within a connecting element 8. In this regard, by way of example, a connecting element 8 can be screwed to the heat sink 6, as explained with reference to FIGS. 1 to 3, and latched to the printed circuit board 7 as explained with reference to FIG. 19. Conversely, a fixing element can also be latched to the heat sink 6 by means of resilient latching lugs 88, as explained in FIG. 19, and screwed to the printed circuit board 7 as explained for FIGS. 1 to 3.

In principle, all connection techniques explained herein may be realized either in semiconductor module arrangements in which the projections 91 are parts of the semiconductor module 5 and the receiving regions 92 are parts of the heat sink 6, or conversely in semiconductor module arrangements in which the projections 91 are parts of the heat sink 6 and the receiving regions 92 are parts of the semiconductor module 5.

In all instances, the projections 91, upon introduction into the receiving regions 92, may merely descend into the associated receiving regions 92 without the occurrence of plastic deformations of the projections 91 or of the receiving regions 92, or else with a plastic deformation of the projections 91 and/or the receiving regions 92. Moreover, in all instances, a heat conducting medium 90 may be introduced between the semiconductor module 5 and the heat sink 6, as was explained above with reference to FIGS. 1 to 3.

Figure 20A:
FIG. 20A shows a sectional view through a projection embodied as a pin.

As shown in FIGS. 20A to 20D, the projections 91 may have a wide variety of shapes. In this regard, a projection 91 can be embodied for example as a substantially straight pin, as shown in FIG. 20A. Optionally, a projection 91 can taper conically at the end by which the said projection is first inserted into the associated receiving region 92, in order to facilitate insertion. The cross sections of a projection 91 may vary; they can be as shown, for example, rectangular, square or round. However, many other cross sections such as, for example, triangular, pentagonal, hexagonal or octagonal are also likewise possible.

Figure 20B:
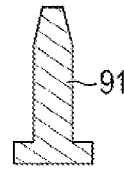
FIG. 20B shows a sectional view through a projection embodied as a pin and having a widened mounting base.

As shown in FIG. 20B, that end of the projections 91 by which the latter are fixed to the semiconductor module 5 or to the heat sink 6 can be widened in order to provide a larger mounting area for mounting on the semiconductor module 5 or on the heat sink 6 and thus to achieve a higher strength of the connection.

Figure 20C:
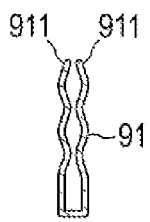
FIG. 20C shows a sectional view through a projection embodied as a spring clip.

FIG. 20C shows a projection 91 embodied as a spring element having, for example, two spring tongues 911.

Figure 20D:
FIG. 20D shows a sectional view through a projection embodied as a bonding wire.

FIG. 20D depicts an additional embodiment of the projection 91 with a bonding wire that, at its lower end, is bonded onto the lower metallization 22 of the circuit carrier 2 or onto the heat sink 6 and cut off and away from the mounting surface approximately perpendicularly, such that the projection 91 has a portion that protrudes from the mounting surface substantially perpendicularly and can be inserted into a corresponding receiving region on the heat sink 6 or on the semiconductor module 5.

In all embodiments of the present invention, a positively locking connection between the semiconductor module 5 and the heat sink 6—if such a positively locking connection is provided at all—is effected at most indirectly via the printed circuit board 7, as is shown in all of the exemplary embodiments. Optionally, the length of the fixing elements 8 can be dimensioned such that the printed circuit board 7 is pre-stressed and thereby presses the semiconductor module 5 against the heat sink 6.

The mounting technique explained herein is also suitable, in particular for semiconductor modules 5 in which the ratio between the mass of the semiconductor module 5 and the basic area thereof is not overly large. By way of example, said ratio can be less than or equal to 5 $g/cm^2$ or less than or equal to 4 $g/cm^2$. Independently thereof, the ratio can also be at least 3 $g/cm^2$.

In addition, suitable semiconductor modules 5 can have a basic area of at least 20 mm×30 mm, wherein the basic area (including for determining the ratios mentioned above) is considered to be the size of the projection area which is obtained if the semiconductor module 5 is placed by the underside 56 onto a plane and projected orthogonally onto the latter.

Figure 21:
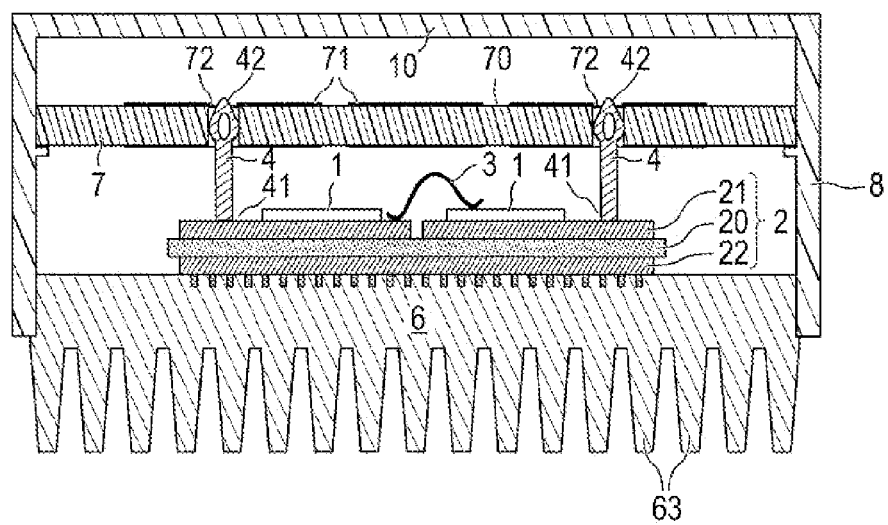
FIG. 21 shows a sectional view through a semiconductor module arrangement wherein the printed circuit board is arranged in a module housing serving as fixing means.
Figure 22:
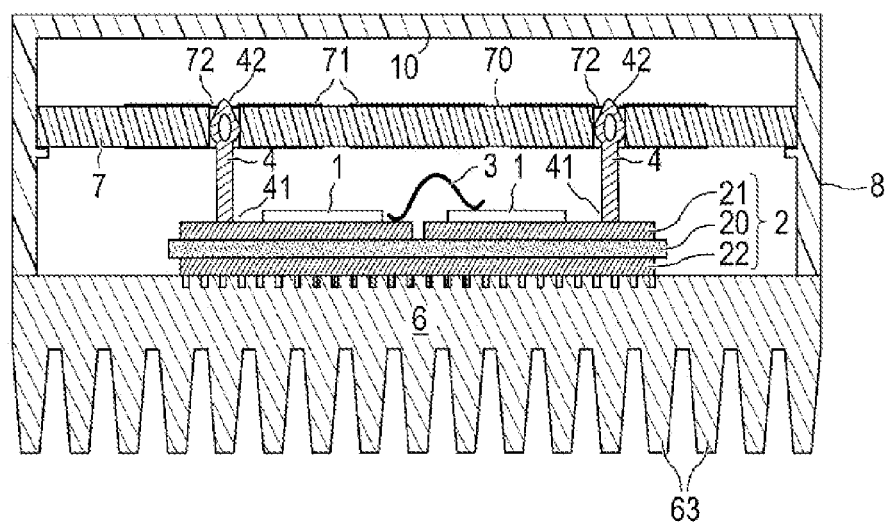
FIG. 22 shows a sectional view through a further semiconductor module arrangement, wherein the printed circuit board is arranged in a module housing serving as a fixing means.

Another embodiment is depicted in FIGS. 21 and 22. In both arrangements, the printed circuit board 7 is arranged within a module housing 10. The module housing 10 simultaneously serves as a fixing means 8, by which the printed circuit board 7 is fixed to the heat sink 6. Suitable connection techniques for connecting the module housing 10 to the heat sink 6 include, for example, adhesive bonding, but also any other connection techniques such as screwing, clipping, latching, etc. Independently thereof, adhesive bonding, screwing, clipping, latching, etc. are likewise suitable as connection techniques for connecting the module housing 10 to the printed circuit board 7. In semiconductor module arrangements wherein the printed circuit board 7, as shown, is arranged completely or alternatively only partly within a module housing 10, all of the above-explained combinations of projections 91 and receiving regions 92 can likewise be realized.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A semiconductor module arrangement, comprising:
    a semiconductor module having a top side, an underside opposite the top side, and a plurality of electrical connection contacts formed at the top side;
    a printed circuit board;
    a heat sink having a mounting side; and
    one or more fixing elements for fixing the printed circuit board to the heat sink;
    wherein either a multiplicity of projections are formed at the underside of the semiconductor module and a multiplicity of receiving regions for receiving the projections are formed at the mounting side of the heat sink; or a multiplicity of projections are formed at the mounting side and a multiplicity of receiving regions for receiving the projections are formed at the underside, each of the projections extend into one of the receiving regions;
    wherein the semiconductor module is electrically conductively connected to and mechanically held by the printed circuit board at the connection contacts;
    wherein the printed circuit board is connected to the heat sink by the one or more fixing elements so that the semiconductor module is interposed between the heat sink and the printed circuit board; and
    wherein no direct positively locking connection is provided between the semiconductor module and the heat sink.

2. The semiconductor module arrangement of claim 1, wherein the semiconductor module is electrically conductively connected to the printed circuit board at the connection contacts by soldering connections or by press-fit connections.

3. The semiconductor module arrangement of claim 1, wherein a thermally conductive paste, a phase change material or an adhesive is arranged between the underside and the mounting side.

4. The semiconductor module arrangement of claim 1, wherein the semiconductor module
    is directly or indirectly fastened to the heat sink without a screw-on opening through which a screw is led.

5. The semiconductor module arrangement of claim 1, further comprising:
    a housing, wherein the one or a plurality of semiconductor chips are arranged in the interior of the housing, wherein each of the fixing elements is arranged outside and spaced apart from the housing.

6. The semiconductor module arrangement of claim 1, further comprising:
    a housing, wherein a plurality of semiconductor chips and the printed circuit board are arranged in the interior of the housing, and wherein the housing is configured as a fixing means by which the printed circuit board is fixed to the heat sink.

7. The semiconductor module arrangement of claim 1, wherein the projections areas comprise pins that are welded, soldered, sintered or bonded onto the underside or up to the mounting side.

8. The semiconductor module arrangement of claim 1, wherein the receiving regions comprise:
    drilled holes or slots in the heat sink or a baseplate of the semiconductor module; or
    sleeves that are welded, soldered, sintered or bonded onto the underside or onto the mounting side of the heat sink.

9. The semiconductor module of claim 1, wherein the projections comprise spring elements or pins that are inserted into one of the receiving regions in a force-locking manner.

10. The semiconductor module of claim 1, wherein a ratio of mass to basic area of the semiconductor module is greater than or equal to 3 g/cm$^2$ and less than or equal to 5 g/cm$^2$.

11. The semiconductor module arrangement of claim 1, further comprising:
    a circuit carrier comprising a ceramic lamina insulation carrier applied to an upper metallization layer and electrically insulating the upper metallization layer from a lower metallization layer; and
    at least one semiconductor chip mounted on the upper metallization layer and electrically conductively connected to the upper metallization layer.

12. The semiconductor module arrangement of claim 1, wherein a ratio between the number of projections and a basic area of the semiconductor module is greater than or equal to 1 cm$^{-2}$.

13. The semiconductor module arrangement of claim 1, wherein each of the projections descends into the corresponding receiving region by a depth of descent of at least 3 mm.

14. A method for producing a semiconductor module arrangement, the method comprising:
    providing a semiconductor module, having a top side, and an underside opposite the top side, and a plurality of electrical connection contacts formed at the top side;
    providing a printed circuit board;
    providing a heat sink having a mounting side;
    wherein either a multiplicity of projections are formed at the underside of the semiconductor module and a multiplicity of receiving regions for receiving the projections are formed at the mounting side of the heat sink; or a multiplicity of projections are formed at the mounting side and a multiplicity of receiving regions for receiving the projections are formed at the underside;
    providing one or more fixing elements;
    producing electrically conductive connections between the connection contacts and the printed circuit board;
    introducing each of the projections into one of the receiving regions, such that each of the projections is at least partly situated in depressions of the receiving regions; and
    connecting the printed circuit board to the heat sink by means of the fixing elements so that the semiconductor module is interposed between the heat sink and the printed circuit board and no direct positively locking connection is provided between the semiconductor module and the heat sink.

15. The method of claim 14, wherein producing the electrically conductive connections between the connection contacts and the printed circuit board occurs prior to introducing each of the projections into one of one of the receiving regions.

16. The method of claim 14, wherein the projections have an excess size relative to the receiving region before the projections are introduced into respective receiving regions.

17. The method of claim 14, further comprising applying an electrical voltage between two of the connection contacts.

\* \* \* \* \*

UNITED STATES PATENT AND TRADEMARK OFFICE
CERTIFICATE OF CORRECTION

| | | |
|---|---|---|
| PATENT NO. | : 9,041,196 B2 | Page 1 of 1 |
| APPLICATION NO. | : 13/957001 | |
| DATED | : May 26, 2015 | |
| INVENTOR(S) | : R. Bayerer | |

It is certified that error appears in the above-identified patent and that said Letters Patent is hereby corrected as shown below:

IN THE CLAIMS

Column 12, line 63 (claim 15, line 4) please change "into one of one of the" to -- into one of the --

Signed and Sealed this
Second Day of February, 2016

Michelle K. Lee
*Director of the United States Patent and Trademark Office*